(12) United States Patent
Gonzalez Inda et al.

(10) Patent No.: US 9,913,401 B2
(45) Date of Patent: Mar. 6, 2018

(54) PIVOTABLE FAN ASSEMBLY AND ASSOCIATED SYSTEMS

(71) Applicant: ARRIS Enterprises, Inc., Suwanee, GA (US)

(72) Inventors: Carlos Paul Gonzalez Inda, Guadalupe (MX); Humberto Cruz Corral, Apodaca (MX); Oswaldo Enrique Linares Rivas, Guadalupe (MX); Luis Lopez Moreno, San Nicolas de los Garza (MX); Julio Cesar Ayala Vera, Apodaca (MX); Monica Arroyo Calderon, Monterrey (MX)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 14/289,949

(22) Filed: May 29, 2014

(65) Prior Publication Data

US 2015/0351280 A1 Dec. 3, 2015

(51) Int. Cl.
*H05K 7/20* (2006.01)
*F04D 19/00* (2006.01)
(Continued)

(52) U.S. Cl.
CPC ....... *H05K 7/20172* (2013.01); *F04D 19/002* (2013.01); *F04D 29/522* (2013.01);
(Continued)

(58) Field of Classification Search
CPC .......... H05K 7/20172; H05K 7/20; H05K 7/20136–7/20145;
(Continued)

(56) References Cited

U.S. PATENT DOCUMENTS 5,707,282 A * 1/1998 Clements .......... H05K 7/20172
361/679.48
6,040,981 A 3/2000 Schmitt et al.
(Continued)

FOREIGN PATENT DOCUMENTS

WO 2006/138285 A2 12/2006
WO WO 2006138285 A2 * 12/2006 ............. H01R 35/04

OTHER PUBLICATIONS

PCT Search Report & Written Opinion, RE: Application No. PCT/US2015/022589; dated Aug. 26, 2015.
(Continued)

*Primary Examiner* — Jerry Wu
*Assistant Examiner* — Stephen Sul
(74) *Attorney, Agent, or Firm* — Thomas A. Ward

(57) ABSTRACT

A pivotable fan assembly includes a mounting frame, a panel, and a bracket. The panel can be coupled to the mounting frame at a first edge. The panel can pivot about the mounting frame between a first position and an angularly displaced second position. At least one fan assembly can be coupled to the bracket, which extends distally from the panel with a first pair of adjacent sides of the fan assembly bounded by the panel and the bracket and a second pair of adjacent sides of the fan assembly unbounded and exposed. When attached to a chassis cover, the panel can pivot to expose the fan assembly for tool-less replacement.

19 Claims, 10 Drawing Sheets

(51) Int. Cl.
*F04D 29/52* (2006.01)
*F04D 29/64* (2006.01)
*G06F 1/18* (2006.01)
*G06F 1/20* (2006.01)

(52) U.S. Cl.
CPC ............ *F04D 29/646* (2013.01); *G06F 1/181* (2013.01); *G06F 1/20* (2013.01); *H05K 7/20136* (2013.01); *H05K 7/20727* (2013.01)

(58) Field of Classification Search
CPC ....... H05K 7/20572–7/20581; H05K 7/20736; G06F 1/181; G06F 1/20–1/203; H01R 35/04; F04D 19/002; F04D 29/646; F04D 29/522; F04D 29/60–29/648
USPC ....... 361/695, 679.47, 679.48; 415/126, 140, 415/141, 129, 132, 189, 190, 213.1; 454/184; 417/363
See application file for complete search history.

(56) References Cited

U.S. PATENT DOCUMENTS

| | | | |
|---|---|---|---|
| 6,592,327 B2 | 7/2003 | Chen et al. | |
| 6,999,313 B2 | 2/2006 | Shih | |
| 7,009,841 B2 | 3/2006 | Chen et al. | |
| 7,048,498 B2* | 5/2006 | Kosugi | F04D 29/601 415/118 |
| 7,054,155 B1* | 5/2006 | Mease | H05K 7/20581 165/104.34 |
| 7,522,415 B2 | 4/2009 | Fan et al. | |
| 8,089,754 B2* | 1/2012 | Peng | H05K 7/20727 312/236 |
| 2002/0141154 A1 | 10/2002 | Huang et al. | |
| 2004/0115986 A1* | 6/2004 | Chen | F04D 29/601 439/485 |
| 2004/0264127 A1 | 12/2004 | Chiu | |
| 2005/0249603 A1* | 11/2005 | Kang | H05K 7/20172 416/244 R |
| 2006/0003683 A1* | 1/2006 | Chen | H05K 7/20172 454/184 |
| 2006/0256522 A1* | 11/2006 | Wei | H05K 7/20581 361/695 |
| 2007/0053159 A1* | 3/2007 | Crippen | H05K 7/20172 361/695 |
| 2008/0043432 A1 | 2/2008 | Hung | |
| 2008/0200050 A1* | 8/2008 | Byrne | H02G 3/185 439/131 |
| 2008/0253886 A1* | 10/2008 | Chen | F04D 29/601 415/213.1 |
| 2009/0195979 A1* | 8/2009 | Ji | H05K 7/20727 361/679.48 |
| 2011/0252980 A1* | 10/2011 | Isenberg | B01F 7/022 99/452 |
| 2012/0148387 A1* | 6/2012 | Labrecque | F04D 25/14 415/148 |
| 2012/0275113 A1 | 11/2012 | Chen et al. | |
| 2013/0168066 A1 | 7/2013 | Wang et al. | |

OTHER PUBLICATIONS

Examination Report, RE: Great Britain Application No. GB1519395, dated Jan. 31, 2017.
Examination Report, RE: Great Britain Application No. GB1519395.6, dated Nov. 11, 2016.

* cited by examiner

PIVOTABLE FAN ASSEMBLY AND ASSOCIATED SYSTEMS

BACKGROUND

Technical Field

This disclosure relates generally to fans, and more particularly to fan assemblies.

Background Art

The processing power of integrated circuits and microprocessors is continually increasing. At the same time, the physical size of these devices is decreasing. Year after year, manufacturers produce smaller processors and integrated circuits that offer more computational power. While these technological advances yield smaller devices with more computational capabilities, there are tradeoffs that must be considered. A primary tradeoff is the fact that these smaller devices produce large amounts of heat, which must be removed for the devices to operate properly. This issue of excess heat generation is exacerbated when large numbers if integrated circuits and processors are densely populated in computer and server housings.

Illustrating by example, in server systems and other advanced computing platforms, large numbers of processors, memory devices, drivers, and other circuit components may be populated on printed circuit boards disposed within a chassis. When these components are all working simultaneously, they generate tremendous amounts of heat. This heat must be removed from the chassis to prevent the circuit components from overheating.

Figure 1:
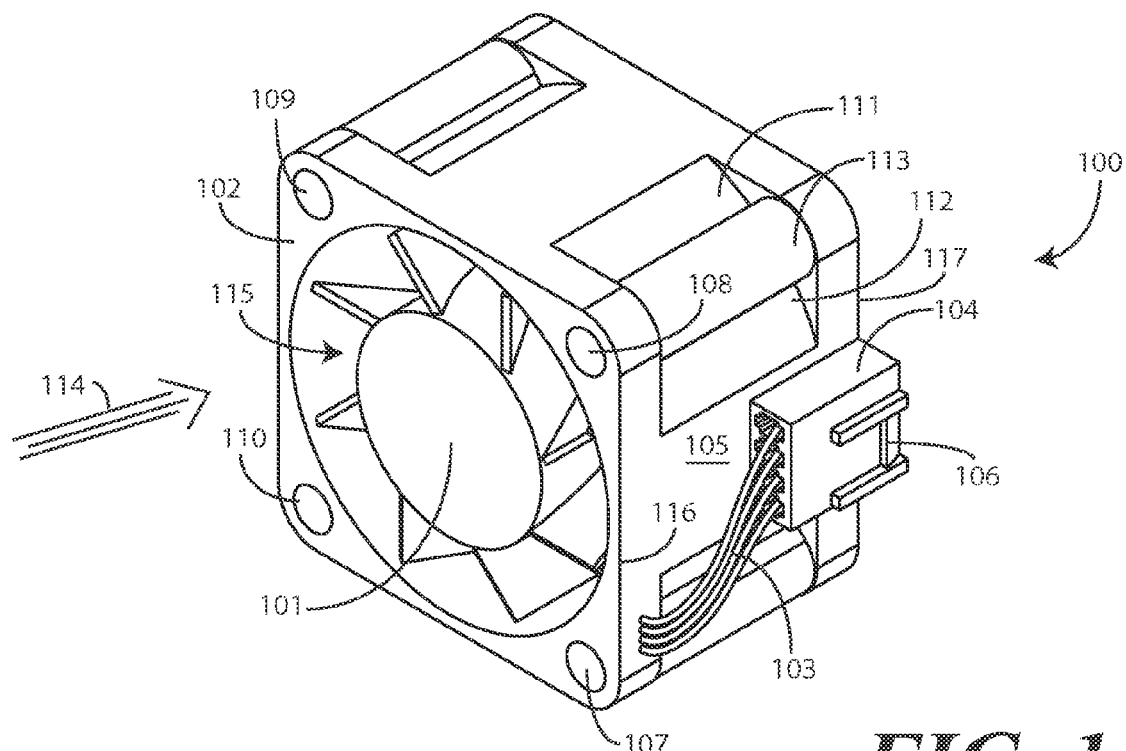
FIG. 1 illustrates one explanatory fan assembly in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. It is expected that one of ordinary skill, notwithstanding possibly significant effort and many design choices motivated by, for example, available time, current technology, and economic considerations, when guided by the concepts and principles disclosed herein will be readily capable of generating the fan assemblies, tool-less removal devices, and chassis configurations described below with minimal experimentation.

As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

As noted above, in advanced computing systems, large amounts of heat must be reliably removed from the housing or chassis of a computational device to keep the temperature-sensitive electronic circuits inside operating properly. The traditional method for removing heat is to place one or more fans along the vertical sidewalls of the chassis. These fans are bolted in place along the sidewalls to hold them in place. They are then powered by electronic busses disposed within the chassis.

While in this traditional configuration of bolting fans to the sidewalls, or alternatively bolting the fans to the bottom wall, fans can be functionally effective in removing heat, it is not without certain problems. Many of these computers systems are continually powered. Consequently, the fans attached to the chassis must run constantly. It is known, however, that fans periodically degrade and fail, and therefore must be replaced. In conventional systems, this requires powering down the electronic components in the chassis (and quite frequently the entire computational system those components support), removing the chassis from the system, at least partially disassembling the chassis with specialized tools to remove the fan. A technician must then replace the fan and re-assembling the chassis with the specialized tools. Only then can the electronic components and system be brought back on-line. These steps are labor intensive and time consuming to say the least, each of which results in additional cost for the system manufacturer.

A second problem associated with conventional systems is the fact that placement of fans along the vertical sides of a chassis consumes valuable chassis real estate that could be used for other things. For example, a chassis manufacturer may desire to place input or output connections or devices along the sides of a chassis, or alternatively diagnostic tools, gauges, and instruments. Other chassis manufacturers may wish to apply stylistic or other aesthetically pleasing ornamentation on the sides of the chassis to differentiate their products in the marketplace. An engineer's requirement that six fans be disposed along the front face of the chassis to keep the system reliably operational disrupts each of these goals.

Some prior art attempts to satisfy the placement of fans other than on the sides has included placing fans in the middle of the chassis. This has been done because modular slots are located in the front where electronic modules are loaded, and rear sides include several input/output connectors. When fans are permanently placed in this location, serviceability represents a problem due to the number of operations, time, and skilled resources consumed for fan replacement. Some other prior art solutions to facilitate fan replacement are focused on fans disposed at the front end or rear end of the product, instead of at the middle of the chassis.

Embodiments of the present disclosure provide a solution to the issues provides above. Embodiments of the disclosure provide a pivotable fan assembly that can be disposed not on the sides of a chassis, but along a top cover or a bottom cover of the chassis interior to the sides of the chassis. This interior location means that the fans can be removed from the sidewalls of the chassis, thereby freeing room for diagnostic devices, input and output devices, or stylized or other aesthetically pleasing ornamentation.

Additionally, embodiments of the disclosure provide a pivotable fan assembly that allows for the tool-less removal of fans via a simple "snap out and snap in" process. Advantageously, a technician can replace a fan very quickly using only their fingers. In one or more embodiments, this quick swap of the fan can occur while the components within the chassis are running, thereby allowing the technician to perform a "hot swap" on the fan without the need for any complex tools.

Moreover, in one or more embodiments where the fans are disposed interior to the upper or lower cover, i.e., with portions of the upper or lower cover surrounding the pivotable fan assembly to which the fans are attached, the technicians can replace the fans without having to alter connections to the sides of the chassis in any way. Where, for example, a front panel includes bus connections, input and output connectors, and so forth, none of these connections need to be manipulated or altered when changing fans configured in accordance with one or more embodiments of the disclosure. The technician simply pivots a panel from a closed position to a radially displaced open position, snaps out a fan with their fingers only, snaps another fan in, and closes the panel. The tool-less fan swap is fast and convenient, and results in less down time and reduced cost for the system provider.

In one embodiment, a pivotable fan assembly includes a mounting frame and a panel. The panel is coupled to the mounting frame at a first edge of the panel. The panel then extends distally form the mounting frame to a second edge of the panel. In one embodiment, the panel is configured to pivot about the mounting frame between a first position and an angularly displaced second position.

A bracket is then coupled to the panel. In one embodiment, the bracket extends distally from the panel at substantially an orthogonal angle relative to the panel so as to define an ell. As used herein, the term "about" or "substantially" refers to a measurement, configuration, or alignment that is inclusive or manufacturing tolerances. For example, an angle designed and specified to be orthogonal with manufacturing tolerances of plus or minus 1.5 degrees may be, due to those manufacturing tolerances, 89.1, 91.2, 90.6, or some other angle and still be substantially orthogonal as the term is used herein.

In one embodiment, at least one fan assembly is coupled to the bracket. When the fan assembly is coupled to the bracket, in one embodiment a first pair of adjacent sides of the assembly are bounded by the panel and the bracket while a second pair of adjacent sides of the at least one fan assembly unbounded and exposed. This unbounded and exposed pair of adjacent sides makes the fan assembly easily and readily available to a technician to allow tool-less replacement of the fan assembly after pivoting the panel.

In one embodiment, the pivotable fan assembly is coupled to a cover for a computer chassis or tray. The chassis cover can define a major face having an aperture therein. In one embodiment, the aperture is disposed interior to the chassis cover, which means portions of the chassis cover surround the aperture so that the aperture is not disposed along an edge of the chassis cover. The mounting frame can be coupled to an edge of the aperture such that the panel pivots about the mounting frame between a first position closing the aperture and a second position angularly displaced from the first position. When the panel is in the first position, the one or more fan assemblies coupled to the bracket are disposed within an interior volume of the chassis to cool the electronic devices therein. However, when the panel is in the second position, the one or more fan assemblies are disposed exterior to the chassis, thereby allowing quick and easy replacement.

Embodiments of the disclosure offer numerous advantages over prior art designs. In one embodiment, a retractable fan tray allows easy access from the top of the chassis to the centrally located fans without the need of removing the cover. Since the cover need not be removed, specialized tools and devices are not required for fan replacement. In one embodiment, a fan tray secures fans mounted to a self-retracting panel. The panel is mounted on hinges with torsional springs. The panel lifts and rotates to allow access to the fans beneath the panel. Once the panel is rotated, fans can be released from the tray by pushing a tab of a plastic module. A failed fan can thus be easily replaced. When the panel is released, the assembly returns to a closed position. In one embodiment, this return to the closed position is assisted by the torsional springs. Embodiments of the disclosure provide a competitive advantage for serviceability in the field by reducing equipment down time.

Turning now to FIG. 1, illustrated therein is one explanatory fan assembly 100 suitable for use with embodiments of the disclosure. While the fan assembly 100 of FIG. 1 provides one example for illustration, it will be clear to those of ordinary skill in the art having the benefit of this disclosure that other fan assemblies could equally be used with embodiments of the disclosure. For example, while the fan assembly 100 of FIG. 1 has a generally square cross section, other fan assemblies having rectangular, circular, elliptical, or other cross sectional shapes could equally be used with embodiments of the disclosure.

The fan assembly 100 of FIG. 1 includes a fan 101, a housing 102, and a motor (not shown) disposed within the housing to turn the fan. The fan 101 turns in response to the motor and draws air 114 through a central cavity 115 of the housing 102. The motor is powered, in one embodiment, by a wire buss 103 terminating at an electrical connector 104. In one embodiment the electrical connector 104 is coupled to a sidewall 105 of the fan assembly 100. The electrical connector 104 can include a latching connector 106 to couple to a complementary latching connector coupled to a power source. The housing 102 of FIG. 1 terminates at one or more edges, e.g., edges 116 and 117. In one embodiment, these edges 116,117 are substantially orthogonal corners of the housing 102.

In one embodiment, to make the fan assembly 100 suitable for use with legacy systems, one or more apertures 107,108,109,110 can pass through the housing 102. Screws or bolts can be placed through the apertures 107,108,109, 110 to bold the fan assembly 100 to a conventional chassis along the sidewalls.

In one embodiment, one or more recesses, e.g., recesses 111,112, can be disposed about ducts, e.g., duct 113, through which the apertures, e.g., aperture 108, pass. The recesses 111,112 not only save material in the housing 102, but make the fan assembly easier to hold as well.

Figure 2:
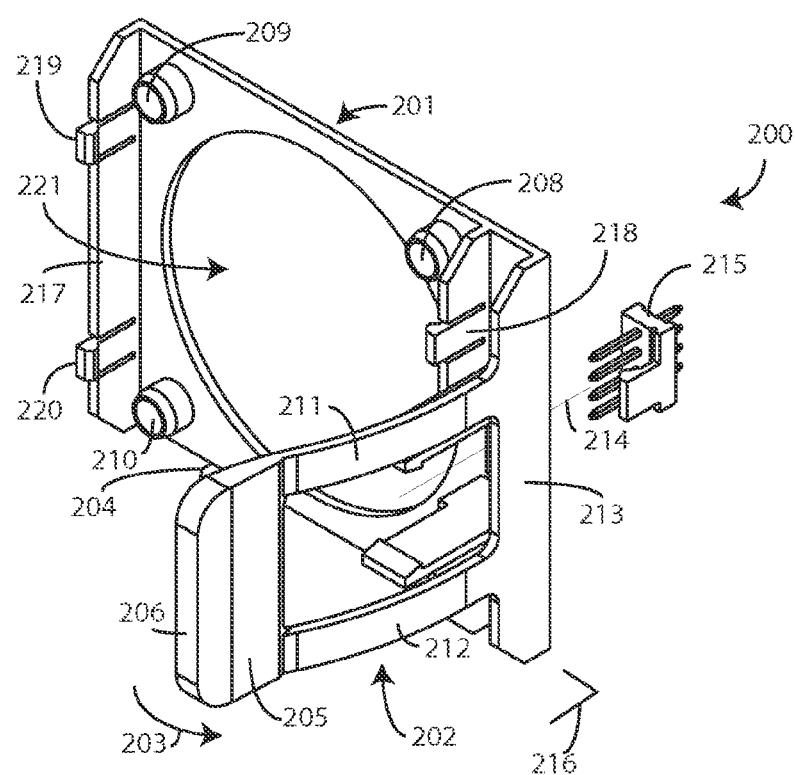
FIG. 2 illustrates one explanatory latching device in accordance with one or more embodiments of the disclosure.

Turning now to FIG. 2, illustrated therein is one explanatory latching mechanism 200 configured in accordance with one or more embodiments of the disclosure. As will be described in more detail below with reference to FIGS. 7-9, in one or more embodiments a fan assembly can be coupled to a bracket with a latching mechanism. The latching mechanism 200 of FIG. 2 is one example thereof. Others will be obvious to those of ordinary skill in the art having the benefit of this disclosure.

The illustrative latching mechanism 200 of FIG. 2 is manufactured from a thermoplastic material by way of an injection molding process. For example, in one embodiment the latching mechanism 200 is manufactured from a polycarbonate plastic resin via an injection molding process. Other thermoplastic materials may also be used, such as acrylonitrile butadiene styrene (ABS), polycarbonate, and polycarbonate-ABS due to their durability. Other equivalents, such as styrene for example, may be substituted. In other embodiments, the latching mechanism 200 can be manufactured of metal, such as spring steel, stainless steel, or other materials.

In one or more embodiments, the material chosen—be it plastic, metal, or other—is selected to provide some compliance. For example, the illustrative latching mechanism 200 of FIG. 2 includes a base member 201 and a cantilevered arm 202. The base member 201 defines an aperture 221 through which the fan (101) of the fan assembly (100) can draw air. In one embodiment, the aperture 221 has an area and size that is substantially similar to that of the central cavity (115) of the fan assembly (100).

As will be described in more detail below, in one or more embodiments the latching mechanism 200 can be used to retain the fan assembly (100) of FIG. 1 to a bracket in a pivotable fan assembly. To provide tool-less removal and replacement of the fan assembly (100), in one embodiment the cantilevered arm 202 angularly deflects 203 relative to the base member 201 to release the fan assembly (100). To provide for this angular deflection 203, in one embodiment the material of the latching mechanism 200 is compliant so that the cantilevered arm 202 can angularly deflect 203 relative to the base member between five and thirty degrees without compromising the structural integrity of the latching mechanism 200.

In one embodiment, when the cantilevered arm 202 is in its rest position, one or more mechanical features 204 extending from a termination beam 205 of the cantilevered arm 202 can engage an edge (116) of the fan assembly (100) to retain the fan assembly (100) to the latching mechanism 200. When a user applies outward pressure to a finger lever 206, the cantilevered arm 202 angularly deflects 203 to a release position where the one or more mechanical features 204 release the edge (116) of the fan assembly (100) for easy removal. In one embodiment, the finger lever 206 can serve as a handle to facilitate fan replacement. In another embodiment, a protrusion or other form of handle can extend from the finger protrusion—or other portion of the cantilevered arm 202—to assist the user in replacing a fan. For example, the user can grasp the handle to assist in deflecting the cantilevered arm 202 in one or more embodiments.

In one embodiment, the cantilevered arm 202 is a singular beam extending substantially orthogonally from the base member 201. In the illustrative embodiment of FIG. 2, the cantilevered arm 202 is configured with two cantilevered beams 211,212 extending substantially orthogonally from a lever beam 213 and terminating at the termination beam 205. This "open" design where an aperture 214 is defined within the cantilevered arm 202 provides various advantages over a solid design where a singular beam extends from the base member 201. A first advantage is there is a material savings in that no material is needed at the aperture 214. A second advantage is that the force required to make the cantilevered arm 202 angularly deflect 203 can be tuned by varying the cross-sectional area of each cantilevered beam 211,212. A third advantage, which will be shown in more detail with reference to FIG. 4 below, is that the aperture 214 can allow visual inspection of the electrical connection at the electrical connector (104) of the fan assembly (100) when the fan assembly (100) is latched to the latching mechanism 200.

In one embodiment, the latching mechanism 200 includes one or more bosses 208,209,210 extending distally from the base member 201. The bosses 208,209,210 are to insert into the apertures (107,108,109,110) of the fan assembly (100). The cantilevered arm 202 then extends from the base member 201 and engages an edge (116) or other feature of the fan assembly (100) to retain the one or more bosses 208,209,210 within the one or more apertures (107,108,109, 110).

In the illustrative embodiment of FIG. 2, four bosses 208,209,210 (with a fourth boss hidden by cantilevered beam 212) are provided to insert into and engage the apertures (107,108,109,110) of the fan assembly (100). In other embodiments, two or three bosses can be used instead of four. Where a fan assembly has more mating features disposed along its engagement face, more bosses can be used. While the bosses 208,209,210 of FIG. 2 are circular in cross section, those of ordinary skill in the art having the benefit of this disclosure will appreciate that other cross-sectional shapes could be substituted for the circular cross sections as well.

The inclusion of the bosses 208,209,210, while optional, offers several advantages. First, the provision of the bosses 208,209,210 provides a quick an easy alignment tool with which to align the fan assembly (100) and the latching mechanism. Second, the provision of the bosses 208,209, 210 prevents lateral translation of the fan assembly (100) when it is latched within the latching mechanism (100). Moments and other lateral forces can be created when the fan (101) is running at high speed. Where the bosses 208,209,210 are included, they provide a stabilizing mechanism that prevents the moments or other lateral forces from dislodging the fan assembly (100) from the latching mechanism 200.

In one or more embodiments, the latching mechanism 200 includes one or more minor cantilever arms 218,219,220. Where, for example, the sidewalls (105) of the fan assembly (100) include surface features such as recesses (111,112), detents, niches, protrusions, or other features, the one or more minor cantilever arms 218,219,220 can engage those surface features to assist in latching the fan assembly (100) to the latching mechanism 200. In the illustrative embodiment of FIG. 2, translational stops are provided to limit translation of the fan assembly (100) as well. For example, sidewall 217 and lever beam 213 act as translational stops to prevent lateral translation of the fan assembly (100) when latched to the latching mechanism 200.

In one or more embodiments, an electrical connector 215 is coupled to the latching mechanism 200. The illustrative electrical connector 215 of FIG. 2 is complementary to the electrical connector (104) attached to the fan assembly (100) of FIG. 1. Said differently, where the electrical connector (104) is a four-pin, female connector, the complementary electrical connector 215 may be a four-pin, male connector. In one embodiment, the electrical connector 215 is to couple to the electrical connector (104) of the fan assembly (100) when the fan assembly (100) is latched to the latching mechanism 200.

In the illustrative latching mechanism 200 of FIG. 2, the base member 201 and the cantilevered arm 202 define an ell 216. In this illustrative embodiment, the electrical connector 215 is disposed within this ell 216. It will be obvious to those of ordinary skill in the art having the benefit of this disclosure that the electrical connector 215 could be disposed in other locations as well based upon the design of the fan assembly (100) to which the latching mechanism 200 is attached. However, disposing the electrical connector 215 within the ell 216 ensures a reliable and robust electrical connection between the electrical connector 215 and the fan assembly as the engagement force applied by the cantilevered arm 202 translates through the electrical connector (104) of the fan assembly (100) to the electrical connector 215 of the latching mechanism.

Figure 3:
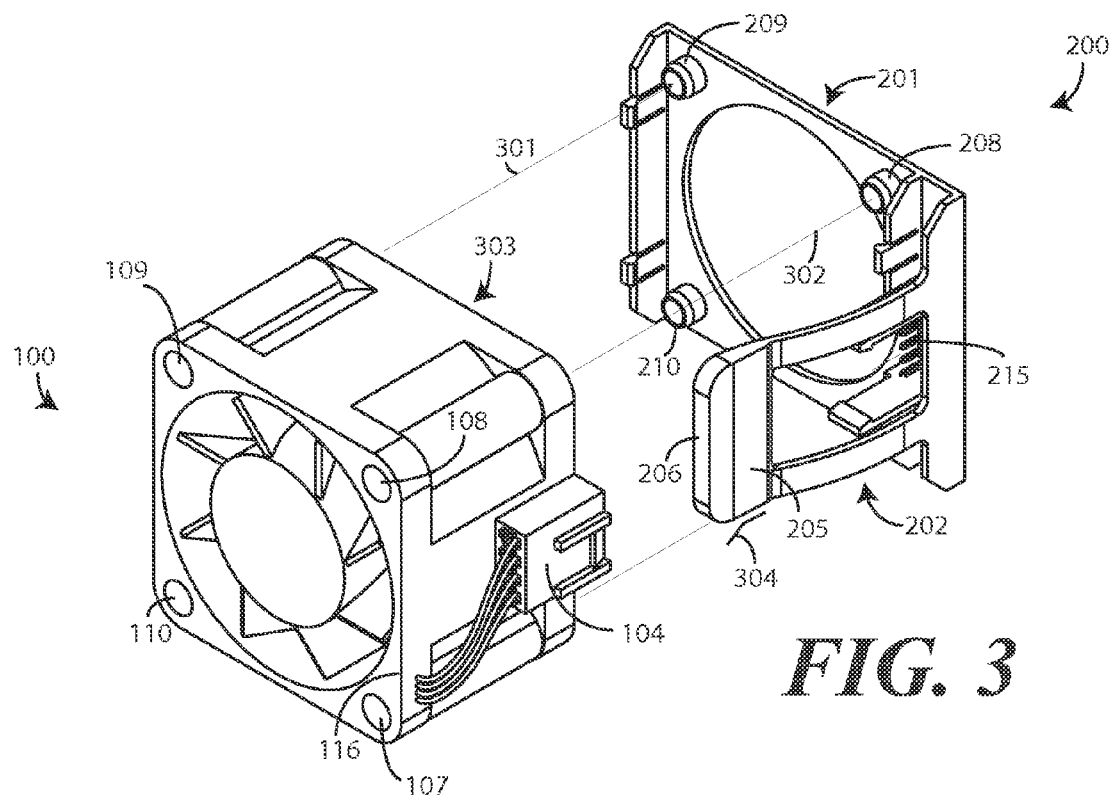
FIG. 3 illustrates one explanatory fan assembly being coupled to an explanatory latching device in accordance with one or more embodiments of the disclosure.

Turning now to FIG. 3, illustrated therein is the fan assembly 100 of FIG. 1 being latched to the latching mechanism 200 of FIG. 2. To attach the fan assembly 100 to the latching mechanism 200, a technician or other person translates 301 the fan assembly 100 toward the latching mechanism 200 such that the one or more bosses 208,209, 210 align 302 with the one or more apertures 107,108,109, 110 disposed along an engagement face 303 of the fan assembly 100.

In one embodiment, the finger lever 206 is configured to extend from the termination beam 205 at an obtuse angle 304. When a side edge of the fan assembly 100, or alternatively the electrical connector 104 of the fan assembly 100, engages the inner surface of the finger lever 206, the cantilevered arm 202 deflects away from the base member 201 to permit the fan assembly 100 to engage with the latching mechanism 200. When this occurs, the one or more bosses 208,209,210 insert within the one or more apertures 107,108,109,110. The electrical connector 215 of the latching mechanism 200 engages the electrical connector 104 of the fan assembly 100. Additionally the cantilevered arm 202 engages an edge 116 or other surface of the fan assembly 100 to retain the fan assembly 100 to the latching mechanism 200. The result is shown in FIG. 4.

Figure 4:
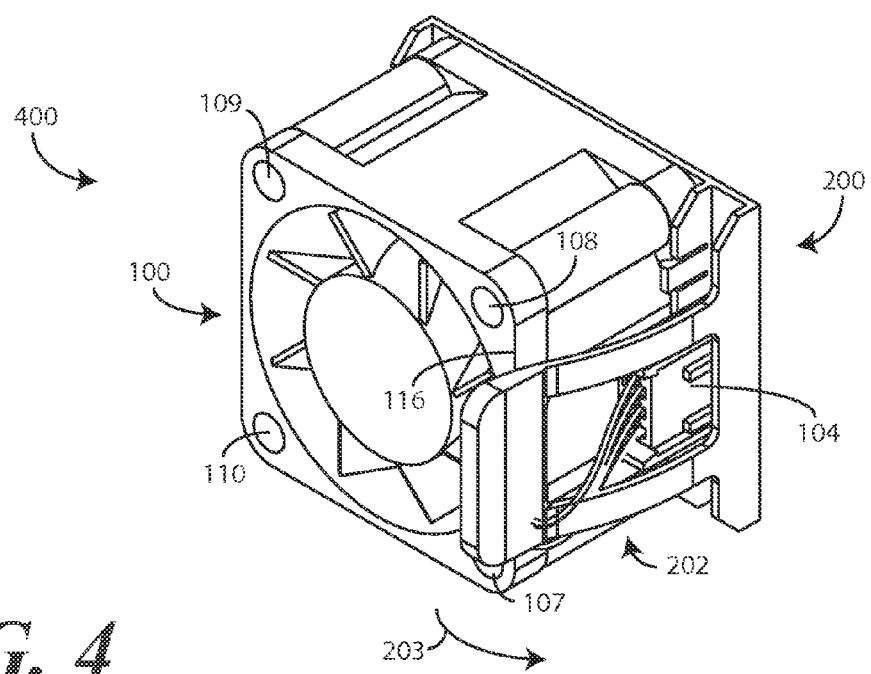
FIG. 4 illustrates an explanatory fan assembly and latching device assembly in accordance with one or more embodiments of the disclosure.

Turning now to FIG. 4, illustrated therein is a latched assembly 400 configured in accordance with one or more embodiments of the disclosure. As shown, the fan assembly 100 is latched within the latching mechanism 200. As shown, the one or more bosses (208,209,210) are seated within the one or more apertures 107,108,109,110. The electrical connector (215) of the latching mechanism 200 is engaged with the electrical connector 104 of the fan assembly 100. Additionally the cantilevered arm 202 engages an edge 116 or other surface of the fan assembly 100 to retain the fan assembly 100 to the latching mechanism 200. A technician or other user can remove the fan assembly 100 from the latching mechanism 200 quickly and easily, and without any tools, by angularly deflecting 203 the cantilevered arm 202 sufficiently to release the edge 116 of the fan assembly.

Figure 5:
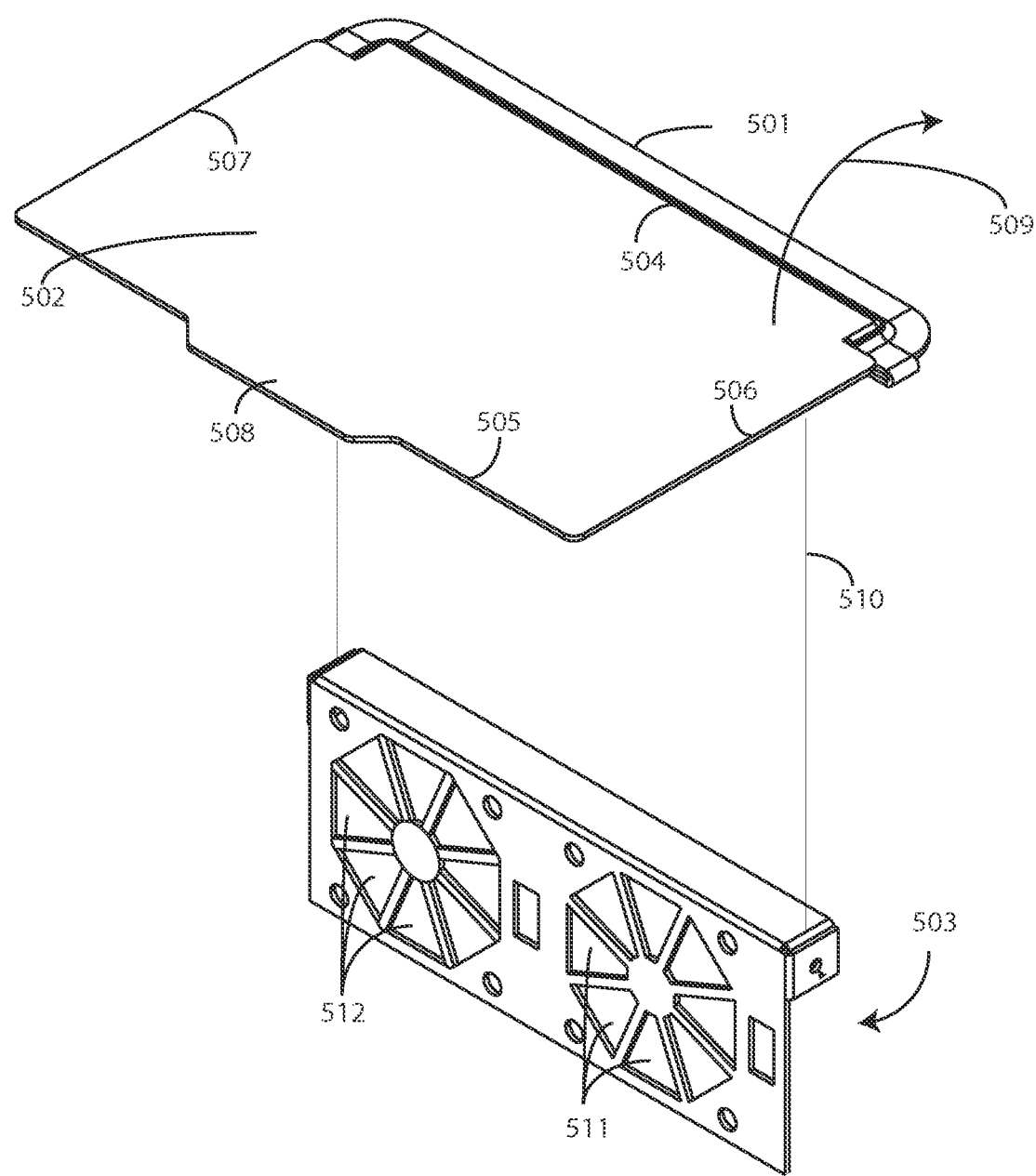
FIG. 5 illustrates an explanatory bracket being coupled to an explanatory panel in accordance with one or more embodiments of the disclosure.

Turning now to FIG. 5, illustrated therein are the base components of one explanatory pivotable fan assembly configured in accordance with one or more embodiments of the disclosure. Shown in FIG. 5 are a mounting frame 501, a panel 502, and a bracket 503. In one embodiment, each of the mounting frame 501, the panel 502, and the bracket 503 are manufactured from metal. It will be obvious to those of ordinary skill in the art having the benefit of this disclosure that other materials, including fiberglass, thermoplastics, or ceramics can be used as well.

In one embodiment, the panel 502 is coupled to the mounting frame 501 along a first edge 504 of the panel 502. The panel 502 then extends distally from the mounting frame 501 to a second edge 505. In one or more embodiments, the first edge 504 and the second edge 505 constitute major edges of the panel, with minor edges 506,507 having lengths shorter than the first edge 504 and the second edge 505. Note that while the panel 502 is shown in FIG. 5 as being substantially rectangular, those of ordinary skill in the art having the benefit of this disclosure will recognize that the panel 502 can take other shapes when viewed in the plan orientation as well, including round shapes, triangular shapes, polygonal shapes, and free-form shapes.

In one or more embodiments, the panel 502 is to pivot 509 about the mounting frame 501 between a first position (shown in FIG. 5) and a second, angularly displaced position, which will be shown in FIG. 9 below. In this illustrative embodiment, the second edge 505 defines a finger engagement ledge 508 with which a user may pivot 509 the panel 502 about the mounting frame 501.

Figure 6:
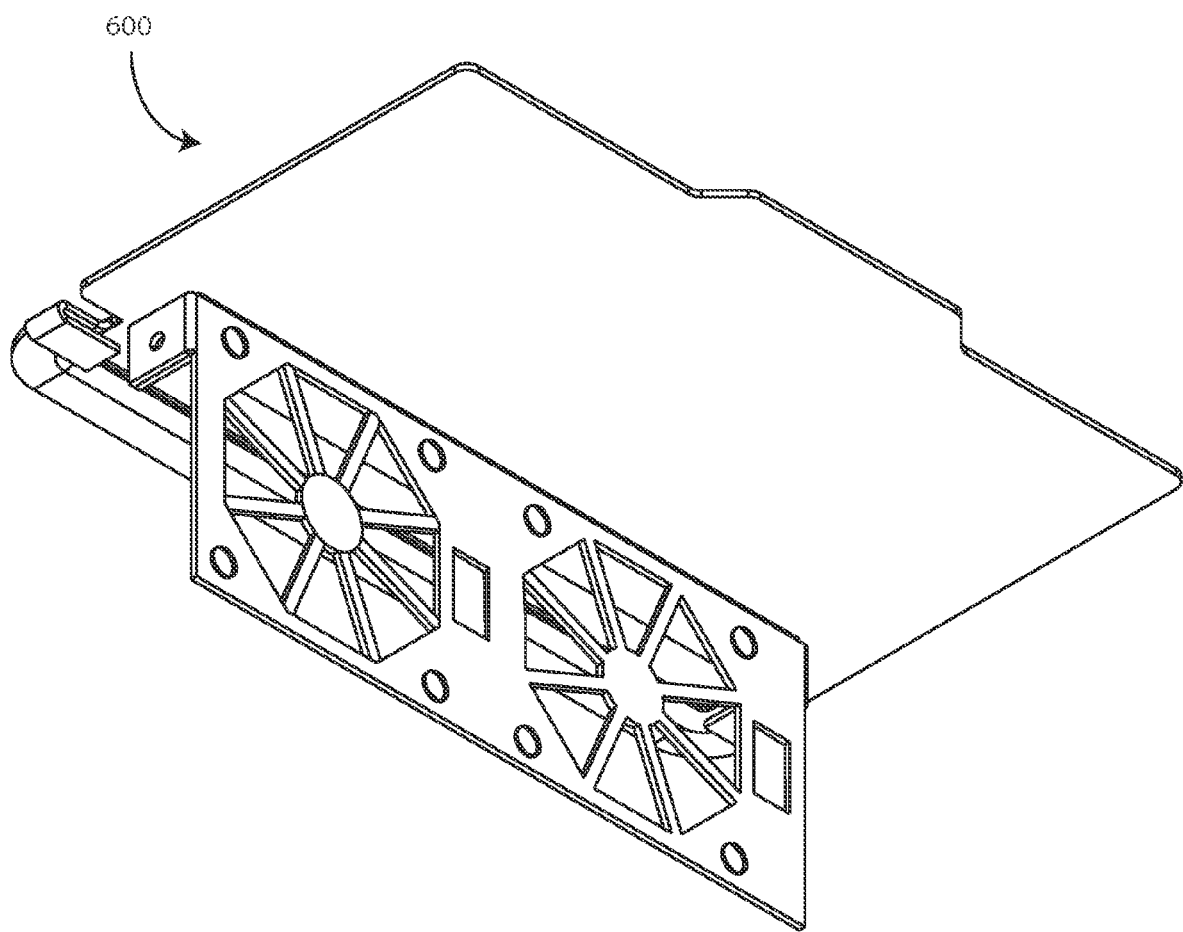
FIG. 6 illustrates an explanatory bracket and panel assembly, which defines an ell, in accordance with one or more embodiments of the disclosure.

A bracket 503 couples 510 to the panel 502 in this illustrative embodiment. The bracket 503 extends distally from the panel 502 at a substantially orthogonal angle relative to the lower major face of the panel 502 in this illustrative embodiment. The bracket 503 includes one or more apertures 511,512 through which a connected fan assembly (100) may draw air when operational. The completed panel-fan assembly 600 is shown in FIG. 6.

Figure 7:
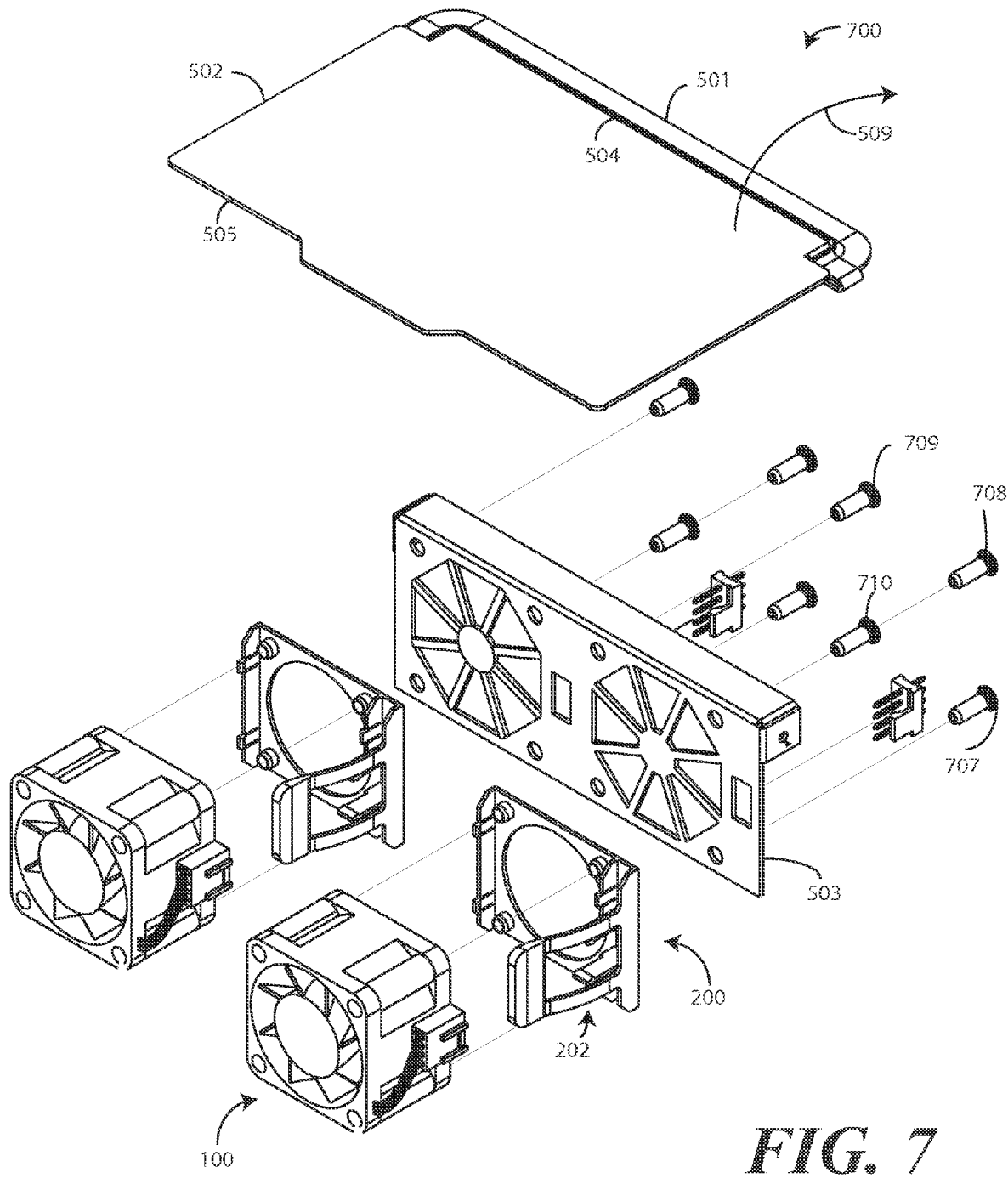
FIG. 7 illustrates an exploded view of one explanatory pivotable fan assembly in accordance with one or more embodiments of the disclosure.

Turning now to FIG. 7, illustrated therein is an exploded view of one explanatory pivotable fan assembly 700 configured in accordance with one or more embodiments of the disclosure. For illustration purposes, the pivotable fan assembly 700 of FIG. 7 is to accommodate two fan assemblies. However, those of ordinary skill in the art having the benefit of this disclosure will recognize that the pivotable fan assembly 700 could be configured to accommodate a single fan assembly or three or more fan assemblies as well by varying the length of the bracket 503 and panel 502, and replicating or eliminating components as necessary. Accordingly, the number of fan assemblies accommodated is not to be construed as a critical, required, or an essential feature or element of any or all the claims.

As described above, the panel 502 is coupled to the mounting frame 501 along a first edge 504 of the panel 502. The panel 502 then extends distally from the mounting frame 501 to a second edge 505. The panel 502 is to pivot 509 about the mounting frame 501 between a first position and an angularly displaced second position.

At least one fan assembly 100 is to couple to the bracket 503. In this illustrative embodiment, a separate latching mechanism 200 is used to couple the fan assembly 100 to the bracket 503. In other embodiments, various features of the latching mechanism 200, such as the cantilevered arm 202, could be integrated into the bracket 503 such that the latching mechanism 200 and bracket 503 comprise a unitary, integrated component.

In this illustrative embodiment, the latching mechanism 200 is fixedly coupled to the bracket 503 by one or more self-cinching studs or pins 707,708,709,710 that are riveted and/or clinched to the bracket 503. While riveting is one possible mode of coupling the self-cinching studs or pins 707,708,709,710 to the bracket 503, others will be obvious to those of ordinary skill in the art having the benefit of this disclosure. For example the self-cinching studs or pins 707,708,709,710 can be fixed to the bracket 503 by adhesives, welding, bolting, screwing, press-fitting, swedging, or other methods. Still other methods will be obvious to those of ordinary skill in the art having the benefit of this disclosure. Further, while self-cinching studs or pins 707,708,709, 710 are one devices suitable for fixedly coupling the latching mechanism 200 to the bracket 503, other devices such as adhesive devices, welding devices, bolting devices, screwing devices, press-fitting devices, friction-fitting devices, or swedging devices will be obvious to those of ordinary skill in the art having the benefit of this disclosure. The latching mechanism 200 is used to couple the fan assembly 100 to the bracket 503 in this illustrative embodiment. In one or more embodiments, the coupling mechanism to the bracket 503 is such that the latching mechanism 200 has enough freedom for the cantilevered arm 202 to move so as to allow a fan assembly to released from, and replaced to, the latching mechanism 200 without the use of tools or specialized devices.

Figure 8:
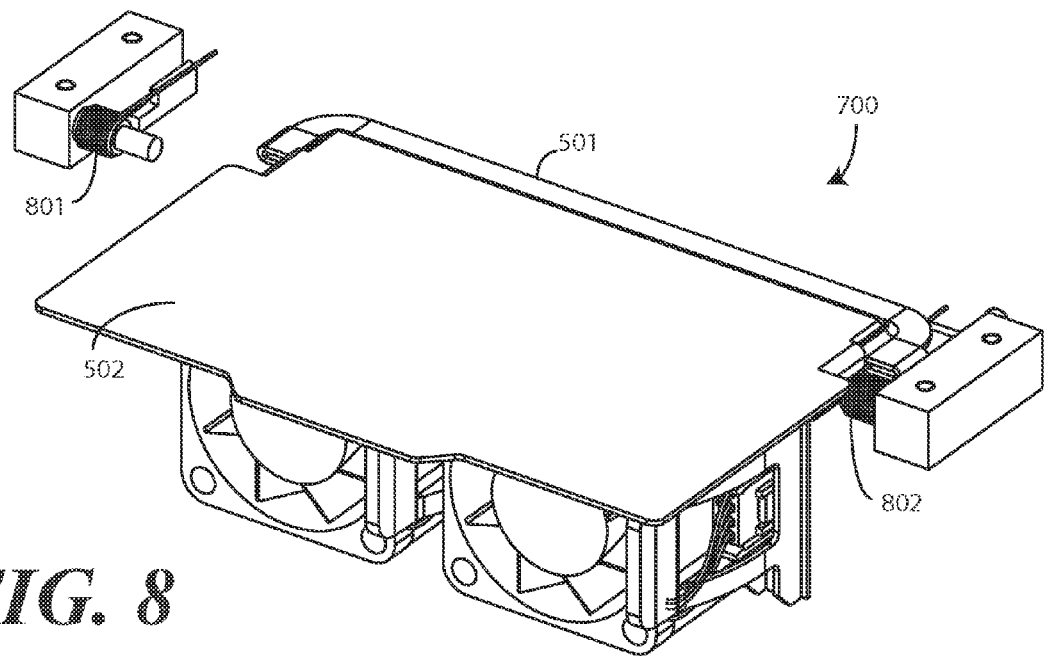
FIG. 8 illustrates another exploded view of a pivotable fan assembly in accordance with one or more embodiments of the disclosure.

Turning now to FIG. 8, in one embodiment, optional torsion springs 801,802 can be used to couple the mounting frame 501 to the panel 502. In one embodiment, the torsion springs 801,802 can be included to bias the panel 502 in a predefined position. For example where the panel is to pivot between a first position and an angularly displaced second position, the torsion springs 801,802 can be used to bias the panel 502 in either position. As will be described below with reference to FIGS. 10-11, in one embodiment the pivotable fan assembly 700 can be placed atop an aperture of a chassis cover. In such a configuration, the panel 502 can be configured to pivot from a first position closing the aperture to a second position, angularly displaced form the first position, in which the aperture is exposed. In one or more embodiments, the optional torsion springs 801,802 can be used to bias the panel 502, for example, in the first position by applying a pre-loading force against the panel 502 to retain the panel 502 in the first position. This pre-loading force, in one embodiment, causes the pivotable fan assembly 700 to be "self-retractable" in that when a technician opens the panel 502, the torsion springs 801,802 apply a loading force to cause the panel 502 to return to the closed position. The pivotable fan assembly 700 is shown in the first position in FIG. 8.

Figure 9:
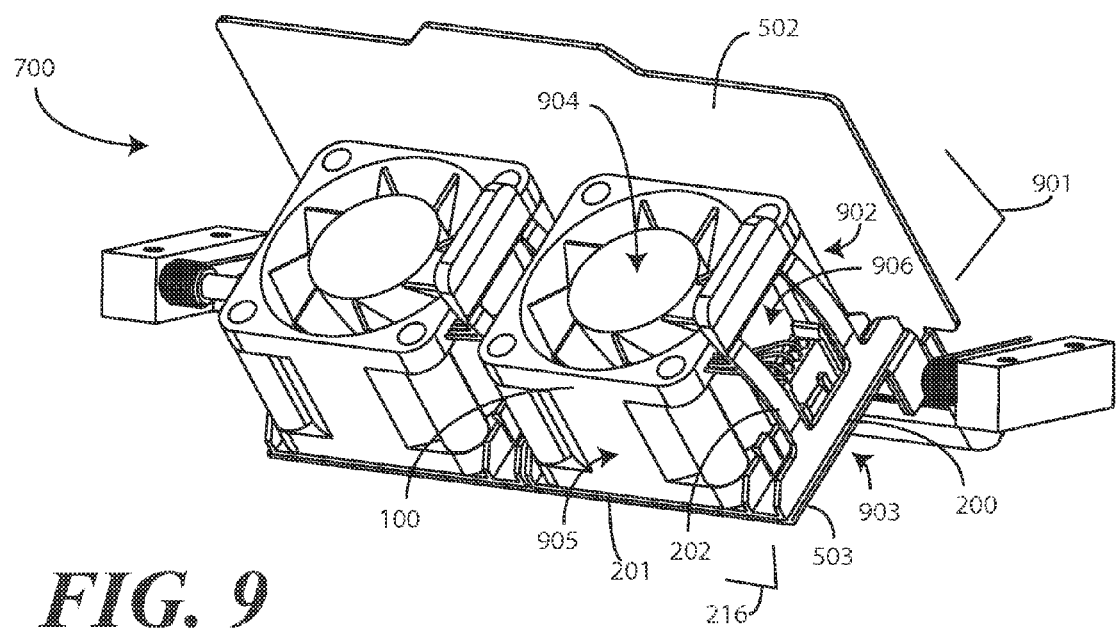
FIG. 9 illustrates an explanatory pivotable fan assembly in accordance with one or more embodiments of the disclosure.

Turning now to FIG. 9, the pivotable fan assembly 700 is shown with the panel 502 pivoted to an explanatory angularly displaced second position. A few advantageous elements of the pivotable fan assembly 700 become visible when the panel is pivoted to this position. Note that in this illustrative embodiment the panel 502 and the bracket 503 define an ell 901 about a pair of adjacent sides 902,903 of the fan assembly 100. This results in the first pair of adjacent sides 902,903 being bounded by the panel 502 and the bracket 503, while a second pair of adjacent sides 904,905 are unbounded and exposed. Note that the in this embodiment the panel 502 does not touch side 902 of the fan assembly 100. Instead it runs along side it in close proximity with the side 902. On the other hand, side 903 is coupled to the latching mechanism 200 and bracket 503. Thus, bounded as used herein covers both configurations.

The exposure and unbounded arrangement of the pivotable fan assembly 700 about the second pair of adjacent sides 904,905 advantageously allows the fan assembly 100 to be removed without tools in one or more embodiments. Since multiple sides 904,905 are unbounded and exposed, a technician or other user can grasp the fan assembly 100 and manipulate the cantilevered arm 202 without tools to quickly and easily release and/or attach the fan assembly 100 to the pivotable fan assembly 700.

In still other embodiments, such as where the latching mechanism 200 is press-fit or friction-fit to the bracket 503, a technician can alternatively remove both the latching mechanism 200 and the fan assembly 100 as a collective unit. Said differently, the latched assembly (400) of FIG. 4 can be removed from the bracket 503 as a single unit, rather than removing the fan assembly 100 from the latching mechanism 200 as described in the preceding paragraph. These two methods illustrate two explanatory methods of exchanging a fan assembly 100 in accordance with one or more embodiments of the disclosure. Still others will be obvious to those of ordinary skill in the art having the benefit of this disclosure.

In this illustrative embodiment, the cantilevered arm 202 and base member 201 also define an ell 216 about the fan assembly 100. Specifically, the cantilevered arm 202 and the base member 201 define an ell 216 about a third pair of adjacent sides 903,906 of the fan assembly 100. Once side, i.e., side 903, is bounded both by the ell 901 defined by the panel 502 and the bracket 503 and the cantilevered arm 202 and the base member 201. Accordingly, in one or more embodiments the first pair of adjacent sides 902,903 and the third pair of adjacent sides 903,906 have a common side 903 between them.

Figure 10:
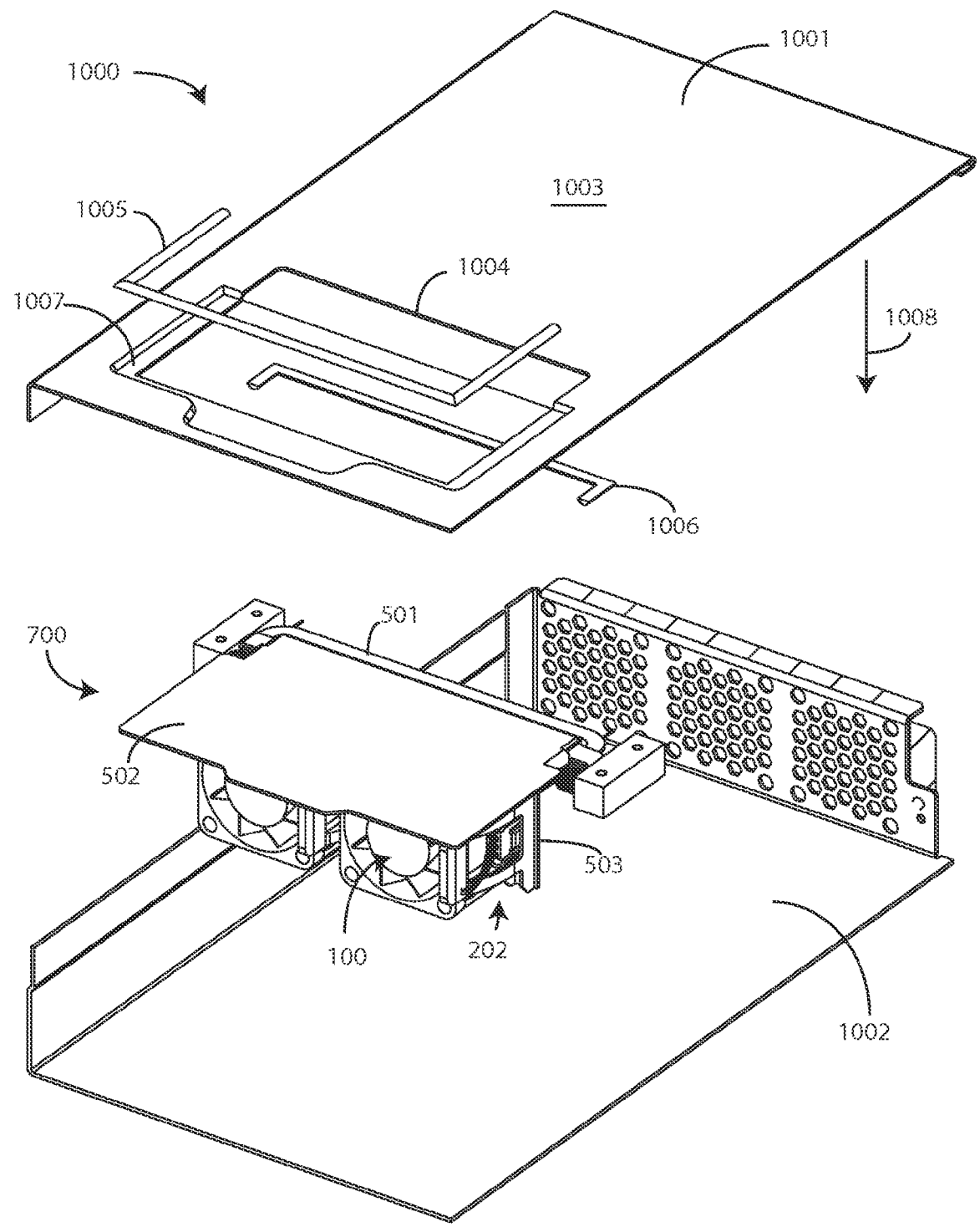
FIG. 10 illustrates an exploded view of an explanatory chassis in accordance with one or more embodiments of the disclosure.

Turning now to FIG. 10, illustrated therein is an exploded view of a chassis 1000 that includes a chassis cover 1001 and a chassis base 1002. In this illustrative embodiment, the chassis cover 1001 includes a major face 1003 that defines an aperture 1004. In this illustrative embodiment, the aperture 1004 has a shape that is complementary to the shape of the panel 502 of the pivotable fan assembly 700. As before, the panel 502 is to pivot about the mounting frame 501 between a first position closing the aperture 1004 and a second position angularly displaced from the first position.

One or more gaskets 1005,1006 can optionally be included to provide a more airtight seal between the pivotable fan assembly 700 and the chassis cover 1001 in one or more embodiments. For example, a first gasket 1005 can be disposed between the panel 502 and a receiving recess 1007 defined within the chassis cover 1001 to receive the panel 502 when in the first position. Similarly, a second gasket 1006 can be disposed between the mounting frame 501 and the chassis cover 1001. In this illustrative embodiment the mounting frame 501 is coupled to the chassis cover 1001 on a major face defining the underside of the chassis cover 1001. As before, the cantilevered arm 202 and the base member (201) of the latching mechanism (200) define a tool-less latching device to permit tool-less removal of the fan assembly 100 from the bracket 503.

When the pivotable fan assembly 700 is coupled to the chassis cover 1001 and is in the first position, i.e., the position shown in FIG. 10, the panel 502 closes the aperture 1004 and the fan assembly 100 is disposed on a first side 1008, i.e., the bottom, of the chassis cover 1001. By contrast, turning now to FIG. 11, when the panel 502 is pivoted to the second position, shown in FIG. 11 and angularly displaced from the first position, the fan assembly 100 is exposed at a second side 1108 of the chassis cover 1001. This position allows a "hot swappable" replacement of equipment cooling fans, e.g., fan assembly 100, regardless of mounting location, e.g., front of chassis cover 1001, rear of chassis cover 1001, or mid-portion of chassis cover 1001, and without the need for cover removal and tools. Additionally, the pivotable fan assembly 700 is self-retractable where torsion springs are included as noted above. This embodiment provides a hinged and self-retractable pivotable fan assembly 700 that can be used at any location of a 1RU or other type chassis. The second side 1108 of the chassis cover 1101 is the top side of the chassis cover 1001 in this embodiment due to the fact that the chassis cover 1001 is disposed on the top of the chassis 1000. Where the chassis cover 1001 was disposed on the bottom of the chassis 1000, the first side (1008) and the second side 1108 would be reversed.

Advantageously, the exposure of the fan assembly 100 via pivoting the panel 502 to the second position allows a technician to simply open the panel, replace the fan assembly 100, and shut the panel again. As noted above, there is no need to employ special tools. Nor is there a need to take the circuit components disposed within the chassis 1000 off-line. Where connectors, diagnostics, or ornamental features were disposed along the vertical sidewalls 1102 of the chassis 1000, there would be no need to disturb these elements either. Advantageously, the pivotable fan assembly 700 of FIG. 11 not only allows the fan assembly to be centrally disposed within the interior volume 1103 of the chassis 1000, but also allows quick and easy tool-less replacement of the fan assembly 100 as well.

Figure 11:
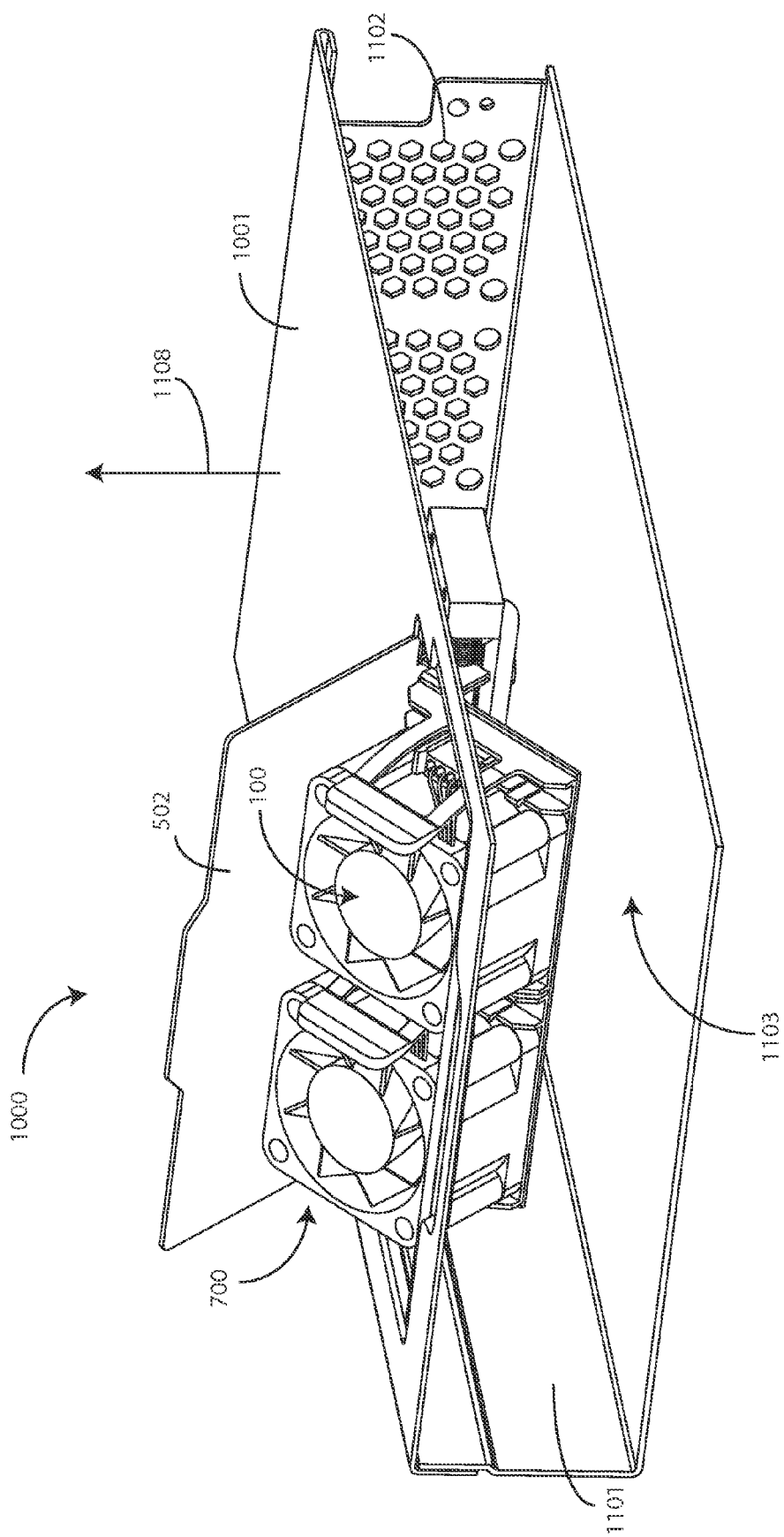
FIG. 11 illustrates a sectional view of an explanatory chassis in accordance with one or more embodiments of the disclosure.

The embodiment shown in FIG. 11 offers advantages over prior art designs. For example, while some prior art designs attempt to provide pivoting fan assemblies, such designs generally provides fan assemblies disposed at the ends of a chassis assembly with a perpendicular axis of rotation. By contrast, embodiments of the present disclosure are disposed at the middle of the chassis 1000 with a horizontal pivoting direction.

Similarly, some prior art designs offer modules that slide into a chassis with a button to facilitate fan replacement. Embodiments of the present disclosure offer advantages over such designs in that the pivotable fan assembly 700 can be located at any location along the chassis 1000 or chassis cover 1001. Additionally, the sliding prior art designs require removal of the chassis cover prior to fan replacement. Embodiments of the present disclosure provide a pivotable fan assembly 700 where a panel 502 can be pivoted to expose the fan assembly 100 without removal of the chassis cover 1001.

Some prior art designs describe removable fan modules integrated with a pivoting handle. The pivoting handle has locking features and facilitates the handling of the fan unit. Such designs can only be used to replace fans at the ends of the chassis. By contrast, embodiments of the disclosure can be used for fan replacement at the middle of the chassis 1000.

Still other prior art designs describe a device that use holders attached to a fan frame that can be slid into a fixed frame in chassis. These designs require removal of the chassis cover for fan replacement and do not employ the advantageous pivoting panel 502 configured in accordance with embodiments of the present disclosure.

Figure 12:
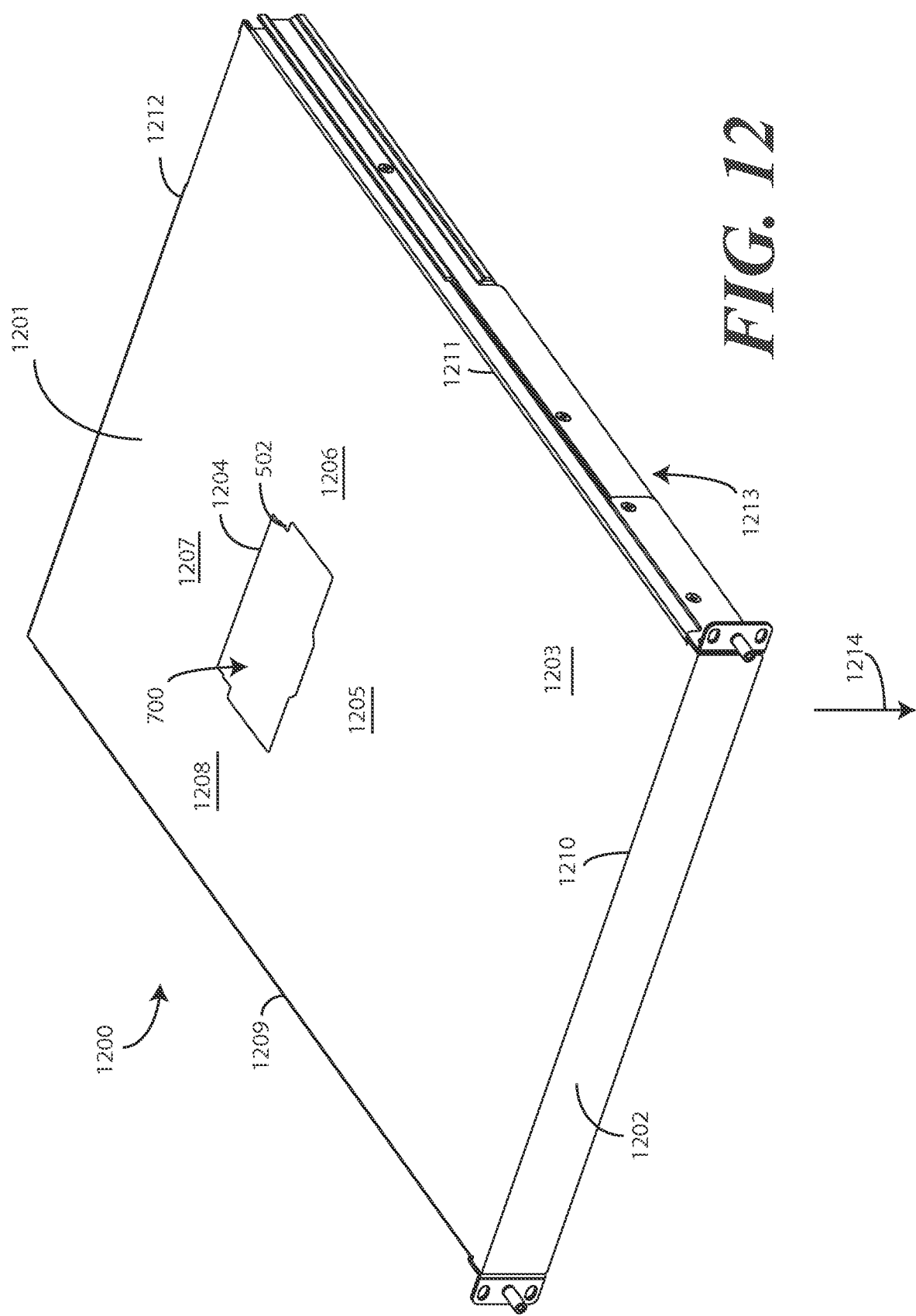
FIG. 12 illustrates an explanatory chassis configured in accordance with one or more embodiments of the disclosure with a panel of a pivotable fan assembly in the closed position.

Turning now to FIG. 12, illustrated therein is another electrical component chassis 1200 configured in accordance with one or more embodiments of the disclosure. As with the chassis (1000) of FIG. 10, the electrical component chassis 1200 of FIG. 12 defines an aperture 1204. This aperture 1204 is disposed interior to the chassis cover 1201, which means that portions 1205,1206,1207,1208 of the major face 1203 of the chassis cover 1201 surround the aperture 1204. In one or more embodiments, the portions 1205,1206,1207, 1208 are at least one inch long so that the aperture 1204 is surrounded by at least an inch of the major face 1203 of the chassis cover 1201 and away from the sides 1209,1210, 1211,1212 of the chassis cover 1201. This interior location allows the one or more fan assemblies coupled to the pivotable fan assembly 700 to strategically cool interior portions of the electrical component chassis 1200 rather than being disposed on distant sidewalls 1202 of the electrical component chassis 1200. As noted above, the pivotable fan assembly 700 could be located at any location along the chassis cover 1201 in one or more embodiments. Further, the pivotable fan assembly 700 could be located along any portion of the bottom surface 1213 of the electrical component chassis as well. In still other embodiments, the pivotable fan assembly 700 could be located on any one of the side surfaces, e.g., sidewall 1202, as well. Still other locations will be obvious to those of ordinary skill in the art having the benefit of this disclosure.

The electrical component chassis 1200 of FIG. 12 includes a top surface, defined by the major face 1203 of the chassis cover 1201, a bottom surface 1213, and one or more side surfaces, e.g., sidewall 1202. These surfaces define an interior volume similar to the interior volume (1103) shown in FIG. 11. The pivotable fan assembly 700 can be disposed along either the top surface, as is the case in FIG. 11, or along the bottom surface 1213. As previously described, the pivotable fan assembly 700 includes a panel 502 to which at least one fan assembly (100) is attached.

The panel 502 is disposed in a closed position in FIG. 12. As the chassis cover 1201 is the top cover in this embodiment, the fan assembly (100) is disposed along an interior of the top surface of the electronic component chassis 1200. Accordingly, gravity 1214 biases the panel 502 in the closed position.

Figure 13:
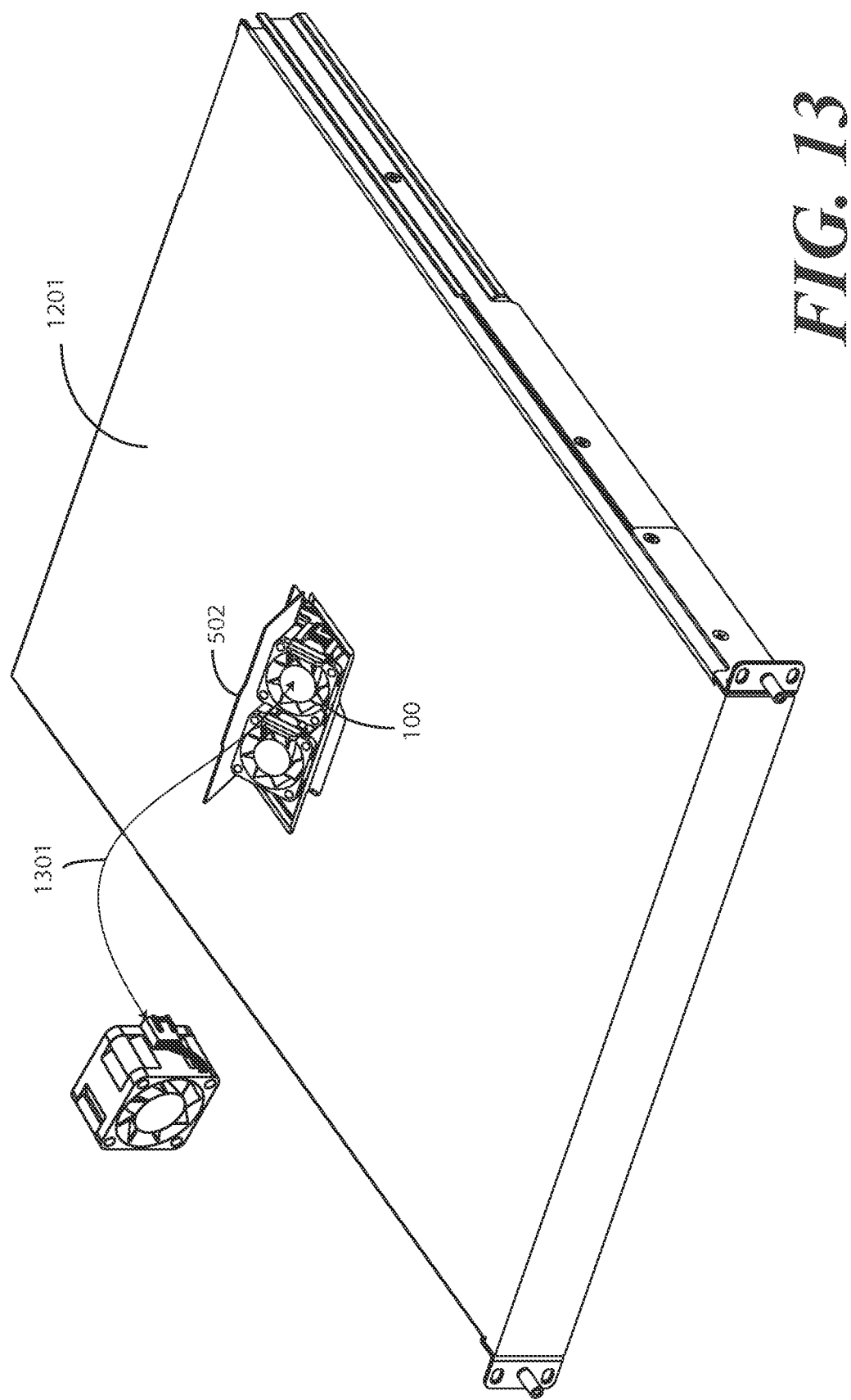
FIG. 13 illustrates an explanatory chassis configured in accordance with one or more embodiments of the disclosure with a panel of a pivotable fan assembly rotated to an angularly displaced open position with a fan being toollessly removed.

In one or more embodiments, the panel 502 is pivotable from a closed position (shown in FIG. 12) with the fan assembly (100) disposed within the interior volume of the electrical component chassis 1200 to an angularly displaced open position, which is shown in FIG. 13. Turning to FIG. 13, when the panel 502 is pivoted to the angularly displaced second position, the fan assembly 100 is exposed exterior of the electronic component chassis 1200, thereby allowing easy removal 1301 and replacement.

As shown and described, embodiments of the disclosure provide a rotating fan tray that facilitates a "hot swap" (replacement of fan assemblies without taking the device the fans are cooling off-line) field replacement of centrally mounted fans without the need for tools. Embodiments of the disclosure specifically address, and provide advantageous solutions for, field replacement of centrally mounted fans without the need to remove the chassis cover. Embodiments of the disclosure provide competitive advantages by reducing failed fan replacement time. Experimental testing has shown that the replacement time can be reduced from an average of 27 minutes, where a chassis cover must be removed with tools, to approximately 38 seconds and without tools. Further, embodiments of the disclosure advantageously allow for fan assemblies to be swapped without taking accompanying equipment offline. Still other advantages will be obvious to those of ordinary skill in the art having the benefit of this disclosure.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A pivotable fan assembly for attaching to a unit for cooling electronic components housed by the unit, comprising:
    a mounting frame for attaching the pivotable fan assembly to an inside cover of the unit housing the electronic components;
    a panel coupled to the mounting frame at a first edge of the panel and extending distally from the mounting frame to a second edge of the panel, the panel to pivot about the mounting frame between a first position and an angularly displaced second position;
    a bracket, coupled to and extending distally from the panel for receiving a fan assembly, wherein when the at least one fan assembly is received by the bracket and the panel is in the first position the at least one fan assembly is disposed within an interior volume of the unit for providing air to the electronic components housed within the unit, and wherein the bracket includes a tool-less latching device, fixedly coupled to the bracket, and the latching device to couple the at least one fan assembly to the bracket to permit tool-less removal of the at least one fan assembly from the bracket; and
    the at least one fan assembly having a first pair of adjacent sides bounded by the panel and the bracket when received by the bracket for pivoting the at least one fan assembly with the panel when the panel is pivoted between the first position and the angularly displaced second position;
    the at least one fan assembly having a second pair of adjacent sides unbounded and exposed when received by the bracket for providing accessibility to release the fan assembly from the bracket when the panel is in the angularly displaced second position while the mounting frame remains attached to the inside cover of the unit housing the electronic components.

2. The pivotable fan assembly of claim 1, the panel and the bracket defining an ell about the first pair of adjacent sides.

3. The pivotable fan assembly of claim 1, the latching device comprising a base member and a cantilevered arm, the base member comprising one or more bosses to insert into one or more apertures of the at least one fan assembly, the cantilevered arm extending from the base member to retain the one or more bosses within the one or more apertures.

4. The pivotable fan assembly of claim 3, the base member and the cantilevered arm defining an ell about a third pair of adjacent sides of the at least one fan assembly.

5. The pivotable fan assembly of claim 4, the first pair of adjacent sides and the third pair of adjacent sides comprising a common side.

6. The pivotable fan assembly of claim 1, further comprising one or more minor cantilever arms to attach to one or more sides of the at least one fan assembly.

7. The pivotable fan assembly of claim 1, the latching device comprising an electrical connector to couple to the at least one fan assembly.

8. The pivotable fan assembly of claim 7, the electrical connector disposed within an ell defined by the latching device.

9. The pivotable fan assembly of claim 1, the bracket defining one or more apertures, the at least one fan assembly do draw air through the one or more apertures.

10. A chassis cover, comprising:
    a major face defining an aperture disposed interior to the major face;
    a mounting frame coupled along an edge of the aperture;
    a panel to pivot about the mounting frame between a first position closing the aperture and a second position angularly displaced from the first position;
    a bracket extending from the panel for receiving a fan assembly, wherein the bracket includes a tool-less latching device, fixedly coupled to the bracket, and the latching device to couple the at least one fan assembly to the bracket to permit tool-less removal of the at least one fan assembly from the bracket; and
    the at least one fan assembly pivotable with the panel between the first position and the angularly displaced second position;
    the at least one fan assembly disposed at a first side of the chassis cover when the panel is in the first position, the at least one fan assembly disposed within an interior volume of the unit for providing air to electronic components housed within the chassis; and
    a plurality of sides of the at least one fan assembly exposed at a second side of the chassis cover when the panel is in the second position for providing accessibility, while maintaining the chassis cover in position, to release the fan assembly from the bracket when the panel is in the angularly displaced second position.

11. The chassis cover of claim 10, the aperture surrounded by portions of the major face of the chassis cover.

12. The chassis cover of claim 10, further comprising a torsion spring to bias the panel in the first position.

13. The chassis cover of claim 12, further comprising one or more gaskets disposed between the panel and the chassis cover.

14. The chassis cover of claim 10, further comprising a latching device comprising a base member disposed between the at least one fan assembly and the bracket.

15. The chassis cover of claim 14, further comprising a cantilevered arm extending from the base member, the at least one fan assembly coupled to the bracket by the cantilevered arm.

16. The chassis cover of claim 14, the at least one fan assembly to draw air through one or more apertures defined in the base member and the bracket.

17. The chassis cover of claim 15, the cantilevered arm and the base member defining the tool-less latching device to permit tool-less removal of the at least one fan assembly from the bracket with the removal being snap out.

18. An electronic component chassis, comprising:
- a top surface, a bottom surface, and one or more side surfaces defining an interior volume of the electronic component chassis;
- a pivotable fan assembly disposed along, and interior to, one of the top surface or the bottom surface, the pivotable fan assembly comprising a panel having at least one fan assembly attached thereto for cooling electronic components housed by the electronic component chassis;
- the panel pivotable from a closed position with the at least one fan assembly disposed within the interior volume of the electronic component chassis for providing air to the electronic components housed within the chassis to an angularly displaced open position exposing plural sides of the at least one fan assembly exterior to the electronic component chassis for providing accessibility, while maintaining a position of the surfaces of the chassis, to release the fan assembly from a tool-less latching device that is fixedly coupled to the bracket, and the tool-less latching device being coupled to the at least one fan assembly to permit tool-less removal of the at least one fan assembly from the bracket when the panel is in the angularly displaced second position.

19. The electronic component chassis of claim 18, the pivotable fan assembly disposed along and interior to the top surface, wherein gravity biases the panel in the closed position.

* * * * *